United States Patent

Schonauer et al.

[11] Patent Number: 5,936,307
[45] Date of Patent: Aug. 10, 1999

[54] SURFACE MODIFICATION METHOD FOR FILM STRESS REDUCTION

[75] Inventors: Diana M. Schonauer; Subhash Gupta, both of San Jose; Paul Besser, Cupertino; Bhanwar Singh, Morgan Hill, all of Calif.

[73] Assignee: Advanced Micro Devices, inc., Sunnyvale, Calif.

[21] Appl. No.: 08/968,660

[22] Filed: Nov. 12, 1997

[51] Int. Cl.$^6$ .............................. H01L 23/48; H01L 23/52
[52] U.S. Cl. .................... 257/764; 257/753; 257/770; 438/654; 438/692; 438/964
[58] Field of Search ................... 257/764, 751, 257/763, 767, 753, 770, 915; 428/457; 438/654, 656, 692, 693, 964

[56] References Cited

U.S. PATENT DOCUMENTS

| 5,059,582 | 10/1991 | Chung | 505/1 |
| 5,385,868 | 1/1995 | Chao et al. | 437/195 |
| 5,726,497 | 3/1998 | Chao et al. | 428/457 |
| 5,773,890 | 6/1998 | Uchiyama et al. | 257/764 |
| 5,798,296 | 8/1998 | Fazan et al. | 438/592 |
| 5,847,461 | 12/1998 | Xu et al. | 257/764 |

Primary Examiner—Donald L. Monin, Jr.
Attorney, Agent, or Firm—Gerald M. Fisher

[57] ABSTRACT

A method for reducing stress in a TiN layer of a metallization structure, and a silicon wafer portion made by this method. The surface of the dielectric under the TiN is roughened using a water polish with a hard pad, to provide micromounts and valleys on the dielectric surface.

20 Claims, 3 Drawing Sheets

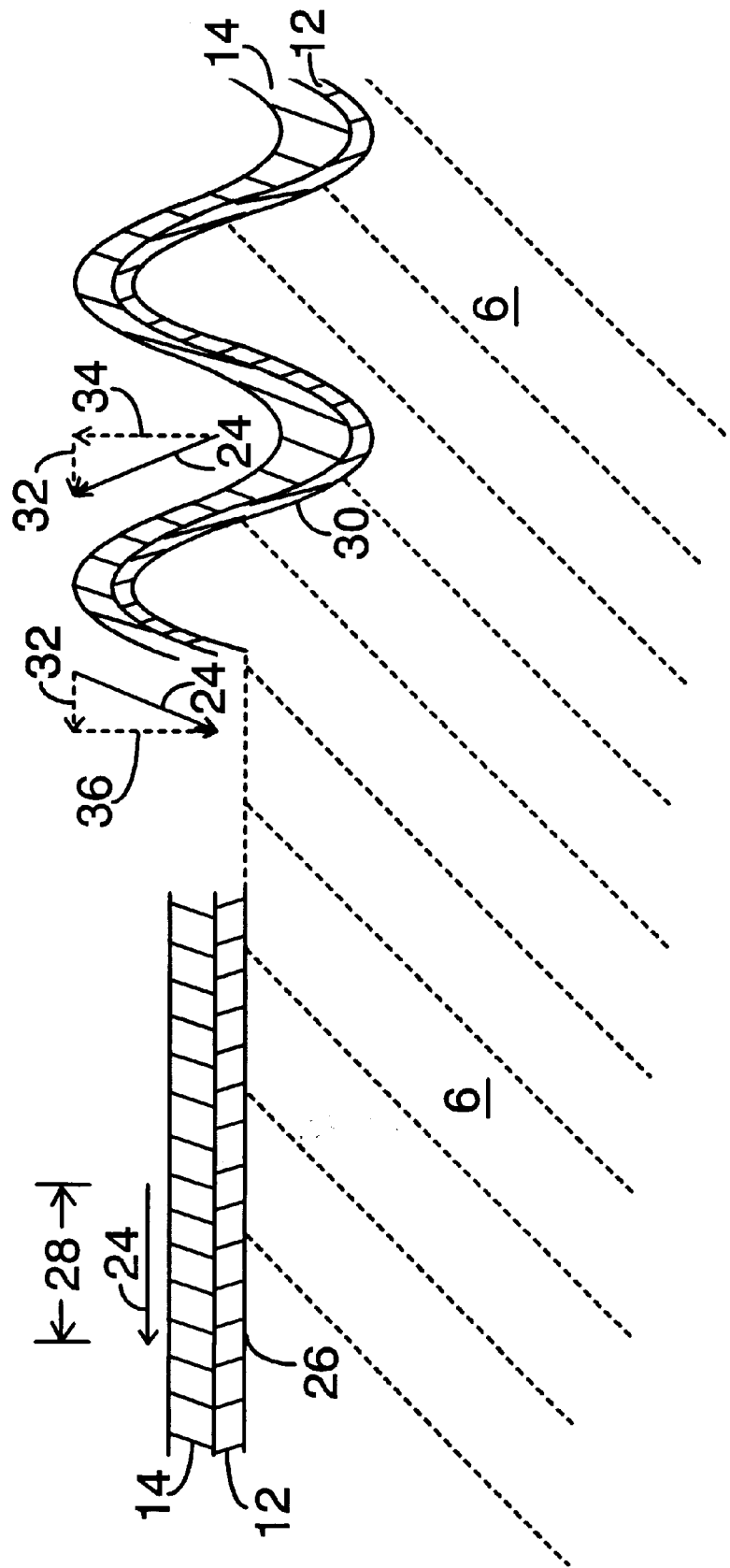

SURFACE MODIFICATION METHOD FOR FILM STRESS REDUCTION

FIELD OF THE INVENTION

This invention relates to processes for integrated circuit manufacturing, and in particular to a method for reducing tensile stress in a TiN layer used in multilevel metallization systems.

BACKGROUND OF THE INVENTION

The refinement and improvement of metallization systems, particularly multilevel metallization systems, are critical to the development of integrated circuit technology, particularly as critical dimensions shrink below one micron.

Multilevel metallization systems are comprised of alternating layers of dielectric and metal materials. Most commonly, the metal layers are comprised mainly of aluminum or aluminum alloys. The metal interconnects in the layer closest to the silicon surface make contact to the underlying silicon devices through contact holes etched in the first interlevel dielectric layer, also known as ILD0. The successive metal layers are electrically connected to each other as required by openings known as vias which are etched through the interlevel dielectric layers. Vias are typically filled with a conductor such as aluminum or tungsten. The conducting material filling the via is called a via plug.

Both the metallic interconnects and the interlayer dielectrics have evolved from simple, single-layer structures into complex structures known as stacks which comprise a series of layers. By way of example, aluminum alloy metallization lines, which may contain small amounts of copper, are typically sandwiched between conducting underlayers and overlayers. Underlayers such as Ti, TiN, or Ti/TiN are deposited onto the dielectric and onto any exposed metal from the metal layer below. These underlayers have been shown to increase the electromigration resistance of the aluminum/aluminum alloy interconnect by improving the grain structure or crystallographic texture of the Al, as well as increasing the grain size. If a void forms in the Al metallization during testing or under operation, this underlayer also serves as a shunt layer and may support continuous current flow. The aluminum or aluminum alloy which serves as the main conductor is deposited over the underlayer, and an overlayer, usually termed the Anti-Reflective Coating (ARC), which serves primarily to enhance the resolution of the lithographic process used for patterning the metal lines, is deposited thereon.

Use of a Ti/TiN underlayer has become a standard for Al metallization, particularly when tungsten via plugs are used. A thin Ti layer is typically sputter deposited, then TiN is deposited over it by sputtering Ti in a nitrogen ambient. One use of the Ti layer is to improve the adhesion of the TiN diffusion barrier layer to the underlying silicon oxide dielectric. The Ti layer in the barrier metal tungsten plug liner also improves adhesion to the antireflective coating (ARC) covering the top of the underlying metal line that the plug is contacting. The TiN on top of the Ti layer serves as a diffusion barrier for the fluorine byproduct left from the WF6 which is used as one of the reactants in the tungsten Chemical Vapor Deposition (CVD) process for via plug deposition. Fluorine reacts with Ti producing titanium fluoride which increases the contact/via resistance. TiN has lower reactivity with fluorine, and thereby yields lower contact/via resistance. The TiN also serves as an adhesion/nucleation layer to the tungsten. Additionally, the use of a Ti/TiN underlayer can improve the resistance of the Al alloy to electromigration failure, compared to a conventional Ti or TiN underlayer alone.

For layered structures as described above employing materials having differing thermal expansion coefficients, stress and stress-induced strain in the aluminum or the Ti/TiN underlayer become issues, particularly during subsequent high-temperature processing steps.

An example of the effects of stress in the aluminum layer is the formation of hillocks. Hillocks are protrusions which form in response to a state of compressive stress in a metal film, and consequently protrude from the film's surface. The compressive stress generally arises from the difference in the thermal expansion coefficient between the metal and the adjacent materials. Hillock growth takes place via a vacancy-diffusion mechanism. Vacancy concentration increases with stress and temperature, and the rate of diffusion is exponentially activated with temperature. Aluminum is particularly susceptible to hillock formation and associated stress-induced voids, due to its low melting point and its consequent high rate of vacancy diffusion. Therefore the ARC overlayer serves an additional important function in aluminum metallization systems. The overlayer is rigid and can withstand the stresses induced in the aluminum film, thereby inhibiting hillock formation.

Another example of undesirable effects of stress in the aluminum layer is the presence of stress-induced, hillock-like extrusions of metal into the via holes which can occur prior to and during deposition of the next metal layer or during the via fill process. Such extrusions and the associated problems have been reported by Shibata et al, in 1993 IEEE IRPS Proc. pg. 340 (1993). In this paper, the authors report occurrence of simultaneous aluminum extrusion into the via hole and void formation in the aluminum interconnects. The voids drastically degrade the reliability of aluminum lines with vias.

Stress in the Ti/TiN underlayer also has negative effects. Due to the differences in molecular structure of the two materials, an oxide/TiN interface (with or without a thin Ti layer therebetween) results in inherent tensile stress in the TiN deposited layer. This stress is manifested by wafer warpage, i.e., the wafer surface becomes convex with respect to the interconnect side, this change in the curvature of the wafer being measurable. Wafer warpage results in alignment problems during subsequent processing steps, due to poor seating of the wafer on its chuck, and the curvature additionally causes linewidth non-uniformity during subsequent lithography and etching steps. Additionally, excessive wafer warpage can cause clamping problems or wafer breakage. All of these factors contribute to lowered yield.

Additionally, it has been experimentally observed that for Al-5% Cu alloy deposited on TiN, higher stress level in the TiN results in more copper segregation to the Al—Cu/TiN interface via grain boundary diffusion. This causes greater amounts of etch residue during ensuing metal etch.

Finally, it is believed that the aforementioned incidence of stress voids and extrusions in the aluminum is correlated with the stress level of the TiN underlayer, due to the stress induced in the aluminum by the physical wafer warpage.

All of the aforementioned negative consequences of stress in TiN layers used in multilevel metallization structures demonstrate the need for methods of reducing this stress.

SUMMARY OF THE INVENTION

It is therefore an object of this invention to provide an integrated circuit manufacturing method for reducing the stress in TiN layers deposited on dielectric layers, in a process which is compatible with existing processes and does not appreciably add to process complexity or cost.

This object is met by utilizing a polishing step on the dielectric surface before Ti/TiN deposition to alter the physical structure of the dielectric surface.

BRIEF DESCRIPTION OF THE DRAWINGS

FIG. 3 illustrates the effect of a roughened dielectric surface on TiN tensile stress vectors.

DETAILED DESCRIPTION OF THE INVENTION

Figure 1:
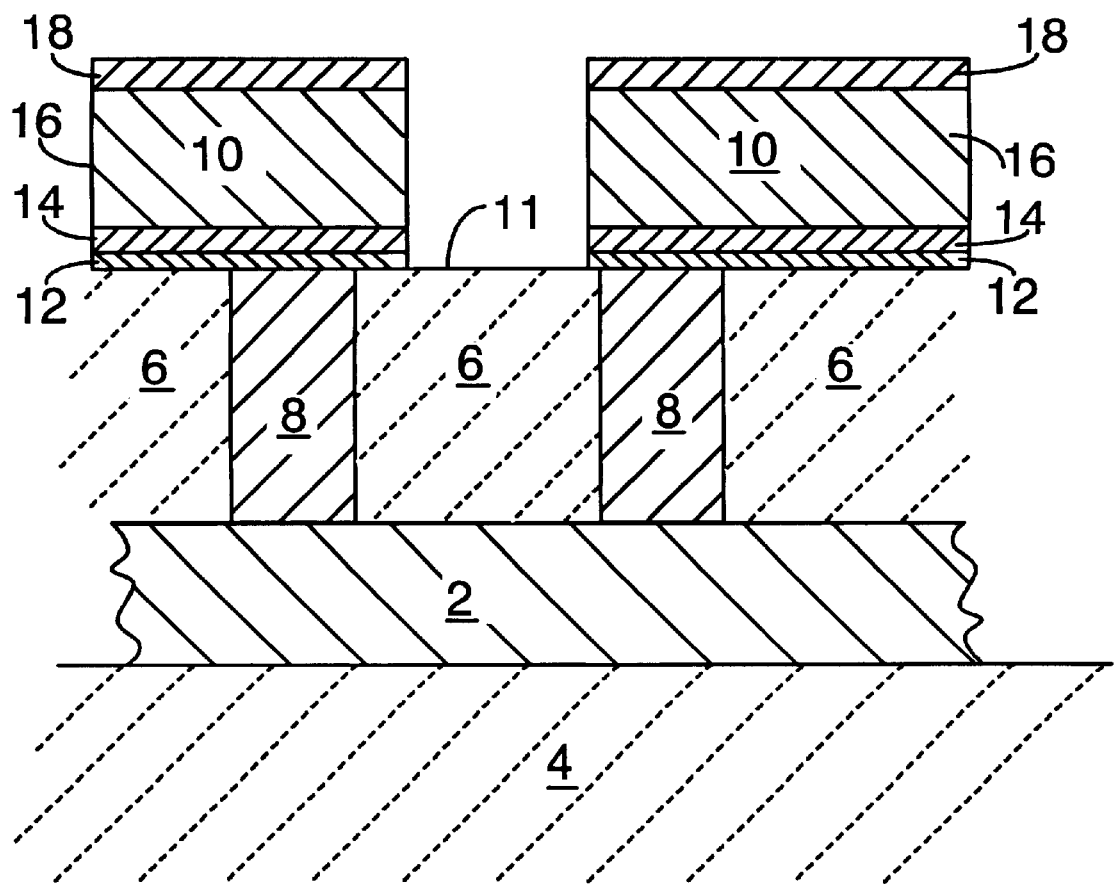
FIG. 1 depicts a portion of a multilevel metallization structure.

FIG. 1 shows a portion of a possible multilevel metallization structure which is typical of those used in an integrated circuit having critical dimensions (CD's) of less than one micron. Bottom metal lines 2 are atop dielectric layer 4, ILD layers 6 provide insulation between successive metal levels, and contacts/vias 8 are filled with conductive material to provide electrical interconnection therebetween. Higher level metal lines 10 are deposited and patterned on top surfaces 11 of ILD's 6, and comprise Ti underlayers 12, TiN underlayers 14, Al—Cu layers 16, and TiN ARC overlayers 18. Our invention addresses the problem of stress reduction in TiN layers 14.

According to our invention, prior to deposition of Ti and TiN underlayers 12 and 14, dielectric surface 11 is treated with a water polish using a hard pad such as the IC1000 pad made by Rodel or the Suba 500 pad. Both of these pads have hardness measuring above 50 as measured by the Shore Durometer "D" scale Tester. Hardness testing and measurement are described in *Mark's Standard Handbook for Mechanical Engineers*, by T. Baumeister, E. A. Avallone, T Baumeister III, 8th ed., McGraw-Hill, NY, 1978, pp 5-12 to 5-15, which is hereby incorporated by reference. The compressibility of the aforementioned pads is in the range between 1 and 12%.

Figure 2:
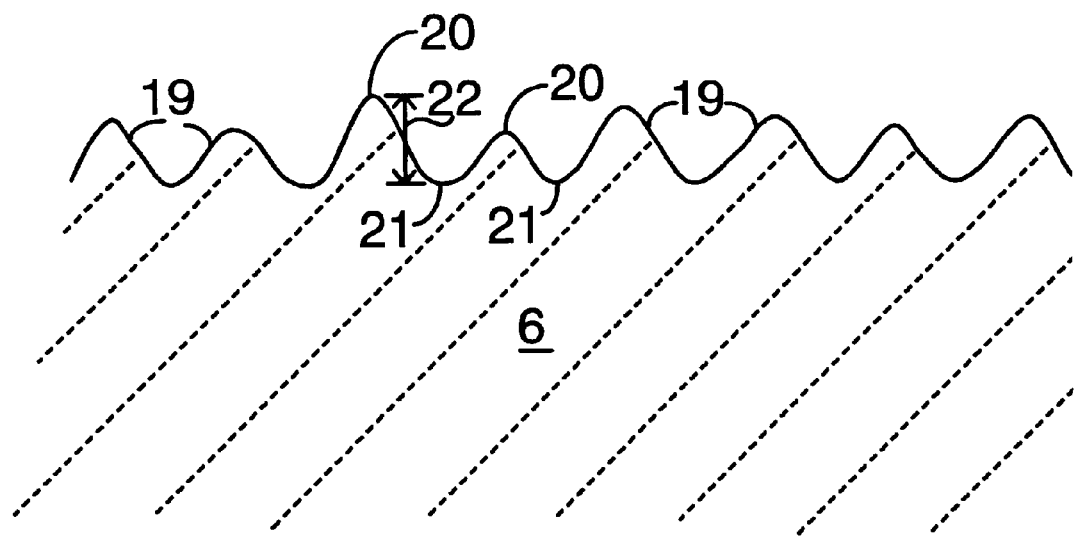
FIG. 2 illustrates the effect of water polish on the dielectric surface.

The roughening effect of this water polish on the dielectric surface is illustrated in FIG. 2. The water polish causes formation of random undulations 19 comprising micromounts 20 and valleys 21 on the untreated top dielectric surface 11. Experimental results described hereinafter evidence a height 22 of undulations 19 of on the order of 29 Angstroms with Root Mean Square (RMS) deviation of 3.6 Angstroms. The density of the undulations is on the order of 100–1000/square micron. In contrast, polishing with a hard pad utilizing an abrasive CMP slurry yields micro-undulations having an approximate height of 21 Angstroms with RMS deviation of 2.7 Angstroms, with a similar density. Polishing with a soft pad, i.e., pads below 10 Shore D on the hardness scale, such as the Politex Supreme pad, with or without slurry can cause only micro-scratches. It has been experimentally determined as described hereinafter that Ti/TiN layers deposited on surface 11 of wafers having undulations 19 have lower stress levels therein than wafers polished with slurry or untreated wafers.

Table 1 summarizes data obtained from five wafers each having 5000 Angstroms of plasma TEOS (TetraEthyl OrthoSilicate) dielectric deposited thereon.

TABLE 1

Stress measurements of Ti/TiN layers over TEOS

| Wafer # | Polish Treatment | Measured Stress |
|---|---|---|
| 1 | Water polish | −3.58E9 dynes/cm² |
| 2 | Water polish | −3.75E9 dynes/cm² |
| 3 | Oxide polish w/slurry | −6.04E9 dynes/cm² |
| 4 | Oxide polish w/slurry | −6.20E9 dynes/cm² |
| 5 | None (control wafer) | −6.44E9 dynes/cm² |

Wafers 1 and 2 were given a water polish for 25–30 seconds using a hard polyurethane pad, the IC1000 pad made by Rodel, on a Westech 372 polisher. Downforce was 5 PSI. Wafers 3 and 4 were polished under the same conditions as wafers 1 and 2, but additionally using 200 cc/min flow of a standard K based oxide abrasive slurry for 43 seconds, to remove approximately 1000 Angstroms of oxide. Wafer 5 was left untreated as a control. Surface roughness $R_a$, defined as the average peak-to-valley amplitude, was measured for one wafer from each category, using an Atomic Force Microscope (AFM) made by Digital Instruments. The water polished wafer had measured $R_a$=0.289 nm, compared with the slurry polished wafer $R_a$=0.217 nm, and compared with the as-deposited TEOS Ra=0.20 nm. All wafers thereafter had 50 Angstroms Ti and 800 Angstroms TiN deposited thereon. Before and after deposition of the Ti/TiN, wafer curvature was measured using a commercially available substrate curvature measurement tool manufactured by Tencor, originally manufactured by Flexus. From the difference in curvature and the film thickness, the stress in the Ti/TiN film was calculated according to the equation:

$$\text{Stress}=[(E^*T_s^2)(1/R_f-1/R_i)]/6(1-v)T_f$$

where $R_i$ is the initial radius of curvature, $R_f$ is the final radius of curvature, E is the Young's Modulus of the silicon substrate, v is the Poisson's ratio of the silicon substrate, $T_s$ is the substrate thickness, and $T_f$ is the film thickness. As seen from Table 1, the experimental results show a slight reduction in stress for the wafers polished with slurry compared with the control wafer, and a substantial reduction in stress for the water polished wafers.

It is believed that the reduction in stress for the Ti/TiN layers over the water polished TEOS is due to the opposing directions of the stress in the Ti/TiN over the micro mounts versus over the adjacent valleys, which tend to negate each other and thus produce less wafer curvature. This effect is illustrated in FIG. 3. Since the stress vector 24 is parallel to the surface, a flat surface 26 yields the total magnitude 28 of vector 24 in the radial direction. In contrast, a rough surface 30 having the same magnitude 28 of stress vector 24 will yield only radial component 32 of vector 24 in the radial direction. Z-components 34 and 36 of the vector will cancel out, being in opposing directions. Since it is the radial component of the tensile stress which causes wafer warpage, this effect is lessened for the roughened surface 30. According to this explanation, the lessening of radial stress is expected to be greater for steeper micro mounts. The columnar structure of the deposited TiN transmits the lowered stress at the interface through the entire TiN layer.

From the experimental results and theoretical predictions, it is believed that the beneficial results from the water polish can be achieved with polishing pads having hardness in the range between 10–58 Shore D and compressibility in the range between 0.5–20%. It is anticipated that tensile stress utilizing pads with parameters in these ranges will be reduced by on the order of 40–50% as compared with the stress for an untreated wafer.

Utilizing this simple, easily implemented technique, substantial reduction in the stress level in TiN underlayers is achieved. The benefits of this stress reduction include increased device reliability and yield, due to lowered electromigration, lower incidence of via extrusions, improved metal etch, and lower yield loss from excessive wafer warpage.

It is not intended that his invention be restricted to the exact embodiment described. For example, the technique could be employed with dielectrics other than TEOS, such as Silane Ox or HSQ, or with other types of polishing apparatus. It is expected that the inventive method would be effective with or without a thin Ti layer under the TiN layer. The scope of the invention should be construed by the claims. With this in mind,

We claim:

1. In a semiconductor manufacturing process for forming on a surface of a silicon wafer a metallization structure where the wafer has a dielectric layer thereon having a top surface, and a first patterned metal layer having metal lines separated by gaps deposited thereon, said first patterned metal layer including a deposited TiN underlayer having tensile stress therein, the improvement comprising:

prior to depositing said TiN underlayer, roughening said top surface of said dielectric layer to reduce said tensile stress in said TiN underlayer, and depositing said TiN atop said dielectric layer top surface.

2. A semiconductor manufacturing process for reducing tensile stress in a TiN underlayer of a metallization structure on a silicon wafer, comprising the steps of:

providing a silicon wafer having a surface;

depositing a dielectric onto said wafer surface, said dielectric having a top surface;

roughening said top dielectric surface after deposition of said dielectric, to provide micro-mounts and valleys thereon; and thereafter depositing said TiN underlayer atop said top dielectric surface.

3. The process of claim 2, further comprising the step of:

after roughening said top dielectric surface and prior to depositing said TiN underlayer, depositing a Ti layer atop said top dielectric surface.

4. The process of claim 2, further comprising the step of:

after depositing said TiN underlayer, depositing a layer comprising Al atop said TiN underlayer.

5. The process of claim 2, wherein said TiN underlayer has a tensile stress therein less than $-4e9$ dynes/cm$^2$.

6. The process of claim 2, where said micro-mounts have an average height greater than 25 Angstroms.

7. The process of claim 6, where said step of roughening said top dielectric surface comprises polishing said top dielectric surface with a hard pad and water.

8. The process of claim 7, wherein said hard pad has measured hardness in the range between 10–58 Shore D.

9. The process of claim 8, wherein said hard pad has measured compressibility in the range between 0.5–20%.

10. The process of claim 9, wherein said top dielectric surface is polished for a duration of 20–45 seconds with a downforce in the range between 2–5 PSI.

11. A silicon wafer portion having a metallization structure thereon comprising:

a first dielectric layer having a top surface;

a first patterned conducting layer having a CD of one micron or less atop said first dielectric layer, said first patterned conducting layer including a TiN underlayer, said TiN underlayer comprising lines separated by gaps;

said top surface of said first dielectric layer having micromounts and valleys therein, said micromounts having a height of at least 25 Angstroms; and said TiN underlayer having a tensile stress therein less than $-4e9$ dynes/cm$^2$.

12. The wafer portion of claim 11 wherein the density of micromounts is on the order of 100–1000 per square micron.

13. The wafer portion of claim 11, wherein:

said first patterned conducting layer further includes a Ti layer under said TiN layer and a layer comprising Al atop said TiN layer.

14. The wafer portion of claim 13, wherein the density of micromounts is on the order of 100–1000 per square micron.

15. The wafer portion of claim 13, further comprising:

a second dielectric layer atop said first patterned conducting layer;

a second patterned conducting layer atop said said second dielectric layer;

via holes through said second dielectric layer, said via holes filled with conducting material to provide electrical interconnection between said first patterned conducting layer and said second patterned conducting layer.

16. A silicon wafer portion made by the process of claim 2.

17. A silicon wafer portion made by the process of claim 5.

18. A silicon wafer portion made by the process of claim 7.

19. A silicon wafer portion made by the process of claim 9.

20. A silicon wafer portion made by the process of claim 10.

* * * * *